(12) United States Patent
Becker-Irvin et al.

(10) Patent No.: US 8,152,108 B2
(45) Date of Patent: Apr. 10, 2012

(54) SOLAR ARRAY PEAK POWER EXTRACTION

(75) Inventors: Craig H. Becker-Irvin, Torrance, CA (US); Winnie W. Choy, Cerritos, CA (US)

(73) Assignee: The Boeing Company, Chicago, IL (US)

( * ) Notice: Subject to any disclaimer, the term of this patent is extended or adjusted under 35 U.S.C. 154(b) by 837 days.

(21) Appl. No.: 12/140,978

(22) Filed: Jun. 17, 2008

(65) Prior Publication Data

US 2009/0310391 A1   Dec. 17, 2009

(51) Int. Cl.
*B64G 1/42* (2006.01)
(52) U.S. Cl. .................................................. 244/172.7
(58) Field of Classification Search ............... 244/158.1, 244/169, 171.1, 171.6, 171.7, 171.8, 171.9; 323/234, 271, 906, 909; 315/77; 60/202; 320/117, 101; 322/80
See application file for complete search history.

(56) References Cited

U.S. PATENT DOCUMENTS

| | | | |
|---|---|---|---|
| 4,186,336 A | | 1/1980 | Weinberg et al. |
| 4,678,983 A | | 7/1987 | Rouzies |
| 5,604,430 A | * | 2/1997 | Decker et al. ................. 323/275 |
| 5,623,398 A | * | 4/1997 | Beach et al. .................... 363/65 |
| 5,648,731 A | | 7/1997 | Decker et al. |
| 6,027,076 A | * | 2/2000 | Krause ...................... 244/158.1 |
| 6,262,558 B1 | | 7/2001 | Weinberg |
| 6,541,916 B2 | * | 4/2003 | Decker ........................... 315/77 |
| 6,581,880 B2 | * | 6/2003 | Randolph et al. ............. 244/169 |
| 6,585,193 B1 | * | 7/2003 | Kustas et al. ................. 244/169 |
| 6,744,236 B2 | * | 6/2004 | Capel et al. .................... 320/101 |
| 6,948,305 B2 | * | 9/2005 | Beattie et al. ................... 60/202 |
| 7,116,568 B1 | * | 10/2006 | Birchenough ................ 323/271 |
| 7,177,164 B1 | * | 2/2007 | Bearden .......................... 363/25 |
| 7,407,137 B2 | * | 8/2008 | Klupar et al. .............. 244/172.7 |
| 2008/0135685 A1 | * | 6/2008 | Soldi et al. .................... 244/169 |

FOREIGN PATENT DOCUMENTS

DE   10061724 A1   3/2002

(Continued)

OTHER PUBLICATIONS

Anderson et al., Solar Panel Peak Power Tracking System, Worchester Polytechnic Institute, Project No. MQP-SJB-1A03, Mar. 12, 2003, pp. 2, 107-111, 126-132, 146-147.

(Continued)

*Primary Examiner* — Galen Barefoot
(74) *Attorney, Agent, or Firm* — Canady & Lortz LLP; Bradley K. Lortz

(57) ABSTRACT

Apparatuses and methods for optimizing power generation of a solar array are disclosed. The bus voltage is regulated with a regulator controlled through one or more reference signals. When the power bus is being used by electrical systems that are tolerant of a higher variable voltage range, the bus voltage can be temporarily set higher by a commanded reference signal to allow additional solar array power to supply to the power bus. The peak power point may be identified through an established relationship with the solar array performance as a function of temperature, season and/or the age of the solar array. In addition, a reference signal controlled by one or more temperature sensors on the solar array may also modify the bus voltage set-point. Improved solar array power may be extracted from spacecraft beginning-of-life to end-of-life operations due to low insertion loss of a direct energy transfer scheme.

20 Claims, 5 Drawing Sheets

FOREIGN PATENT DOCUMENTS

GB 1457739 A 12/1976
WO WO 2005/071512 8/2005

OTHER PUBLICATIONS

Alberts et al., Solar Array Peak Power Tracker, American Society for Engineering Education, Mar. 31-Apr. 1, 2006, Ind. Univ. Purdue Univ. Fort Wayne (IPFW), pp. 1-6.

Alberts et al., Design of a Solar Array Peak Power Tracking System, NASA1 Engineering Inc., May 1, 2006, pp. 1-27.
International Search Report and Written Opinion of the International Searching Authority for International Application PCT/US2009/046602.
Garrigos et al., Abstract for "The Sequential Switching Shunt Maximum Power Regulator and its Application in the Electric Propulsion System . . . ," Power Elec Sp Conf,Jun. 2007.

* cited by examiner

SOLAR ARRAY PEAK POWER EXTRACTION

BACKGROUND OF THE DISCLOSURE

1. Field of the Disclosure

This disclosure relates to regulating voltage of solar arrays to optimize power generation. Particularly, this disclosure relates to regulating voltage of solar arrays to optimize power generation for space applications.

2. Description of the Related Art

Optimal power extraction from an illuminated solar array occurs when the operating array voltage of the solar array is at the peak power point. This array voltage at the peak power point is typically termed the Vmp, the voltage at which the maximum solar array power is generated. Typically, the Vmp is dependent on the age, season and temperature for a given solar array. When a solar array is used in a satellite, the solar array temperature frequently changes due to orbital variation and seasonal changes. The space radiation environment degrades the solar array which affects Vmp. Thus, as the satellite solar array ages, season and temperature change, so does its peak power point, Vmp. On the other hand, the various electrical systems of the satellite are typically designed to operate at a substantially fixed voltage. Accordingly, if the solar array is directly coupled to the electrical systems, it is necessary for the solar array voltage to be similarly fixed at the electrical system voltage level (known as the "bus voltage") to protect the electrical systems. Because the satellite electrical systems do not change their operating voltage as the solar array Vmp changes, it is not possible to extract the maximum solar array power from a solar array at all times. Thus, power generation for the solar array is not optimized.

Different techniques have been employed to address the described power generation inefficiencies. For example, conventional satellites may employ a voltage regulator for the solar array described as a peak power tracker. Peak power trackers set the solar array voltage at an input and deliver a power voltage at an output. Thus, peak power trackers can improve solar array power extraction by continuously operating the solar array at the peak power point. However, it is necessary to regulate the output power voltage. In addition, these peak power trackers usually sense a combination of voltages and currents in order to determine the solar array operating voltage that results in maximum power extraction. Alternately, the solar array may simply designed to be larger than otherwise necessary in order to compensate for inefficient power extraction resulting from unoptimized solar array voltage set to match the bus voltage. A typical conventional satellite solar array may employ a combination of these techniques to achieve the system solution.

A typical conventional peak power tracker system employs a battery-on-bus topology where the power bus is connected to the battery. A pulse width modulator (PWM) regulator (buck or boost) is coupled between the solar array and the battery. By sensing the solar array current and voltage (need data processing to determine the voltage and current to produce peak power) and varying the pulse width or duty cycle of the PWM regulator, peak solar array power is extracted and stored in the battery to support the power bus. A conventional peak power tracker employs complex circuitry to determine peak power point because a data processing capability is required to determine the product of voltage and current calculated to determine peak power point. If the battery is close to being fully charge, duty cycle can be changed to reduce current. In this case, the battery sets the bus voltage.

A commonly used solar array regulator is a shunt regulator which regulates the bus to a fixed voltage by shunting excess solar array current. A shunt regulator can be fully passing, fully shunting or partially shunting and partially passing to match the load demand. The solar array operating voltage is set to the predicted peak power point only at end-of-life (EOL). Therefore a shunt regulator does not extract peak solar array power at beginning-of-life (BOL).

A conventional peak power tracker system that is coupled to the batteries gives rise to another problem because the peak power tracker output is unregulated. Thus, to obtain a regulated bus voltage a second stage DC-DC converter is needed coupled between the peak power tracker output and the power bus. This would increase spacecraft mass and further reduce overall power conversion efficiency.

In any case, the conventional techniques for addressing the described power optimization problem typically introduce a relatively high insertion loss between the solar array and the power bus. Such conventional solutions insertion loss results in power losses estimated at approximately 3% to 5% or even higher if a second stage DC-DC converter is used. Accordingly, although peak power trackers extract some additional solar array power, their benefit is diminished as a result of their own functional losses.

In view of the foregoing, there is a need in the art for apparatuses and methods for regulating the voltage of solar arrays in order to optimize solar array power generation. In addition, there is a need for such apparatuses and methods to optimize solar array power generation with reduced functional losses as compared with conventional solutions. There is particularly a need for such systems and apparatuses in space applications. There is further a need for such apparatuses and methods in space applications to optimize solar array power generation at beginning of life, various seasons and at cold temperature. There is still further a need for such apparatuses and methods in space applications to provide additional power during orbit raising employing electric thrusters. These and other needs are met by the present disclosure as detailed hereafter.

SUMMARY OF THE DISCLOSURE

Apparatuses and methods for optimizing power generation of a solar array are disclosed. Normally, the bus voltage is regulated with a regulator by shunting excess solar array current (or passing the exact amount of solar array current to meet the load demand) and the bus voltage is set by a baseline reference signal. However, when the system power bus is being used by electrical systems that are tolerant of a higher variable voltage range and additional power may be required, the bus voltage can be temporarily set to a higher voltage to maximize solar array power extraction. In this case, a direct energy transfer occurs and maximum power is extracted from the solar array when all the solar array current is passing to the load. The peak power point may be identified through an established relationship with the solar array temperature monitored by one or more temperature sensors, as well as the season and age of the solar array. The technique can be of particular benefit to spacecraft employing an electric propulsion system for orbit raising.

A typical embodiment of the disclosure comprises an apparatus for regulating voltage of a solar array including a solar array for converting solar radiation to electrical power, a regulator coupling the solar array to a power bus and regulating the output voltage of the solar array to a bus voltage at the power bus, and a control circuit directed through one or more reference signals including a baseline reference signal for controlling the regulator to set the bus voltage at the power bus. The one or more reference signals are also used to direct the control circuit to temporarily set the bus voltage higher to provide additional solar array power to one or more voltage-tolerant electrical systems of a spacecraft.

In some embodiments, the one or more voltage-tolerant electrical systems comprises an electric propulsion system of the spacecraft and temporarily setting the bus voltage higher may be performed when employing the electric propulsion system for orbit raising. Furthermore, setting the bus voltage higher may be performed when only the voltage-tolerant electrical systems of the spacecraft are operating and control circuit otherwise sets the bus voltage to a lower bus voltage for one or more voltage-sensitive electrical systems of a spacecraft. For example, the one or more voltage-sensitive electrical systems may comprise payload electronics for the spacecraft.

In some embodiments of the disclosure, the one or more reference signals may include a temperature sensing signal from one or more temperature sensors for the solar array. Furthermore, the one or more reference signals may include a commanded reference voltage signal. The commanded reference voltage signal may be set based on the age of the solar array (e.g., based on predicted performance over time) and/or the season. Typically, the commanded reference voltage signal may be remotely transmitted to the control circuit.

In some embodiments of the disclosure, the one or more reference signals includes a commanded reference voltage signal and a temperature sensing signal from one or more temperature sensors for the solar array. The baseline reference voltage signal is combined with the temperature sensing signal and the commanded reference voltage signal to set the bus voltage at the power bus.

In a similar manner, a typical method for regulating voltage of a solar array, comprises the steps of converting solar radiation to electrical power in a solar array, a regulator coupling the solar array to a power bus, regulating the output voltage of the solar array to a bus voltage at the power bus, controlling the regulator to set the bus voltage at the power bus with a control circuit directed through one or more reference signals including a baseline reference signal, and temporarily setting the bus voltage higher by controlling the regulator directed through the one or more reference signals to provide additional solar array power to one or more voltage-tolerant electrical systems of a spacecraft. Method embodiments of the disclosure may be further modified consistent with apparatus and system embodiments described herein.

In addition, a system for regulating voltage of a solar array, may comprise a solar array means capable of converting solar radiation to electrical power in a solar array, a regulator means capable of regulating the output voltage of the solar array to a bus voltage at the power bus, and a control circuit means capable of controlling the regulator to set the bus voltage at the power bus directed through one or more reference signals including a baseline reference signal. The one or more reference signals direct the control circuit means to temporarily set the bus voltage higher to provide additional solar array power to one or more voltage-tolerant electrical systems of a spacecraft. Setting the bus voltage higher may be performed when only the voltage-tolerant electrical systems of the spacecraft are operating and control circuit means otherwise sets the bus voltage to a lower bus voltage for one or more voltage-sensitive electronics of a spacecraft. System embodiments of the disclosure may be further modified consistent with apparatus and method embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

Figure 1A:
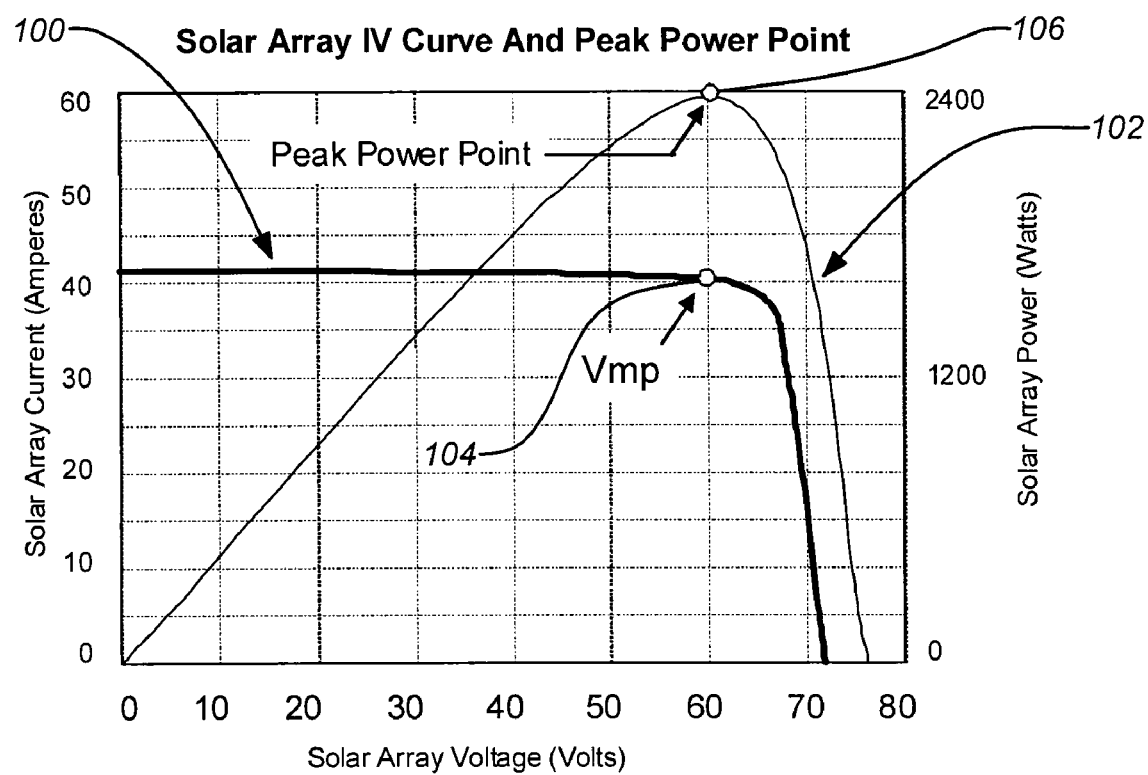
FIG. 1A is an example plot illustrating the performance of a typical solar array versus the solar array voltage.

As previously mentioned, embodiments of the disclosure are directed to optimizing power generation of a solar array. Some embodiments of the disclosure can be implemented through a variable and programmable bus voltage for a satellite. The nominal bus voltage may be selected to correspond with the Vmp of the solar array based on the age-based and seasonal performance prediction for the solar array at the nominal operating temperature. The control method can be applied to modify the existing bus voltage regulation providing additional solar array power to the powered electrical systems. A conventional peak power tracker operates the solar array at Vmp, and its output is unregulated. However, Vmp is a function of temperature, illumination, cell characteristics (including aging) shadowing, and other terms and can vary greatly. A conventional peak power tracker either with a second stage DC-DC converter or a battery-on-bus topology previously described is typically employed to extract peak power from the solar array but it has higher insertion loss. However, embodiments of the present disclosure employ a control circuit to set the bus voltage to extract additional solar array power. Under certain conditions, peak power extraction occurs using direct energy transfer (the solar array output is coupled to the power bus by a diode) when all solar array current is passing to the load and the solar array is operating at the Vmp.

Embodiments of the present disclosure can provide higher power to the voltage-tolerant loads (e.g., electric propulsion systems) and a tightly regulated bus to the voltage-sensitive loads (e.g., payload electronics) during different phases of the spacecraft mission. Particularly, embodiments of the disclosure can provide higher beginning-of-life (BOL) power than conventional solar array systems. This can provide a particular advantage applied to electric propulsion in orbit-raising for a satellite, moving a satellite from lower orbit to higher orbit using electric propulsion methods. Embodiments of the disclosure are applicable to almost any satellite power system design as will be understood by those skilled in the art. In addition, embodiments of the disclosure may be useful for terrestrial solar power systems as well.

The control circuit may be directed through one or more reference signals. In one example, a shunt regulator sets the bus voltage based on one, two or all three reference signals in combination. The fixed reference signal has to be present at all times. The second reference signal is derived as a feedback control from a temperature sensor signal on the solar array; the optimal voltage setting is correlated to the array temperature. The third reference signal is a commanded reference signal. The commanded reference signal may be adjusted based on solar array performance prediction analysis and testing for the solar array. For example, at beginning-of-life (BOL), the set bus voltage may be set higher to extract more solar array power for an electric propulsion system in orbit-raising. The second and the third reference signals may be used to adjust the peak power point over the solar array life.

2. Peak Power for a Solar Array

A typical solar array comprises one or more series-connected photovoltaic cells (known as "strings") that each convert receieved solar radiation to electrical power. The strings of photovoltaic cells are bonded to a structural support. In the case of a solar array for space application, the structural support typically comprises a honeycomb aluminum panel (or possibly a composite panel). Optional features in a solar array design include solar concentrators, reflective panels which reflect additional solar radiation onto the photovoltaic cells. Embodiments of the present disclosure are generally applicable to any solar array configuration known in the art which possess common identifiable performance characterstics.

FIG. 1A is an example plot illustrating the performance of a typical solar array versus the solar array voltage. The plot identifies the peak power point 106 (approximately 2,400 Watts) of the example solar array at the Vmp voltage 104. The peak power point 106 is shown on the power/voltage curve 102. The Vmp voltage 104 (also known as the peak power voltage) is shown on the voltage/amperage curve 100 for the example solar array. Optimal power extraction occurs when the solar array operates at Vmp voltage 104.

Figure 1B:
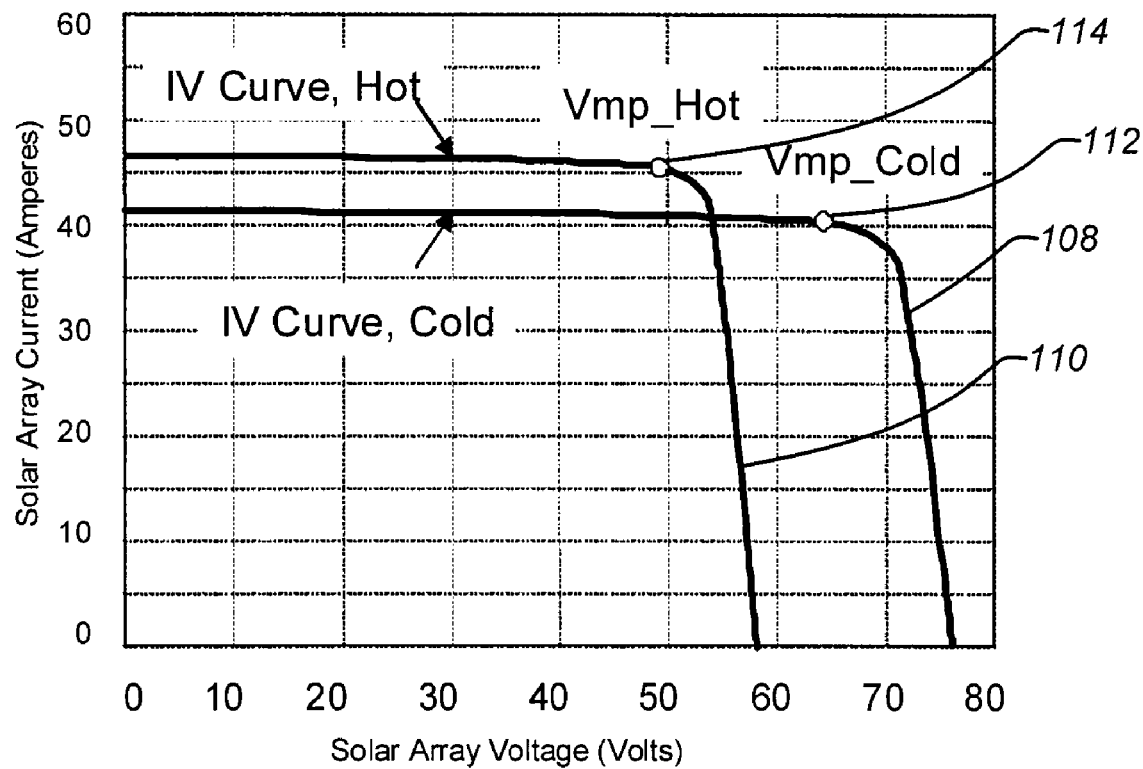
FIG. 1B is an example plot illustrating the performance of a typical solar array versus temperature.

FIG. 1B is an example plot illustrating the performance of a typical solar array versus temperature. This plot illustrates how solar array performance characteristics change with temperature. Two voltage/amperage curves 108, 110, a cold curve 108 and a hot curve 110, are shown for the same solar array operating at different temperatures. As the solar array temperature increases, the Vmp voltage decreases. In the example plot, the cold Vmp 112 is approximately 64 Volts and the hot Vmp 114 is approximately 49 Volts. A typical temperature range (cold to hot) for a solar array is approximately −20° C. to 80° C. There is a substantially linear relationship between temperature and Vmp. For example, the Vmp decreases at a substantially constant rate as the temperature increases. Thus, it is possible to analytically determine the change in Vmp if the change in temperature is known. One novel feature of the disclosure is that in some embodiments, the solar array temperature may be used to predict and change the bus voltage such that the solar array maintains operation at the Vmp voltage.

3. Optimizing Power Generation for a Solar Array

As previously mentioned, the existing solutions (e.g., a conventional peak power tracker) typically introduce relatively large insertion losses between the solar array and the power bus. This insertion loss can result in power losses estimated at approximately 3% to 5% or even higher. In contrast, embodiments of the disclosure can introduce a very low insertion loss between the solar array and the bus, e.g., approximately 1% at 100V. During peak power extraction, the solar array can deliver power to the bus directly through a diode while the solar array operates at the Vmp voltage. Thus the insertion loss is very low in the direct energy transfer method.

Figure 2:
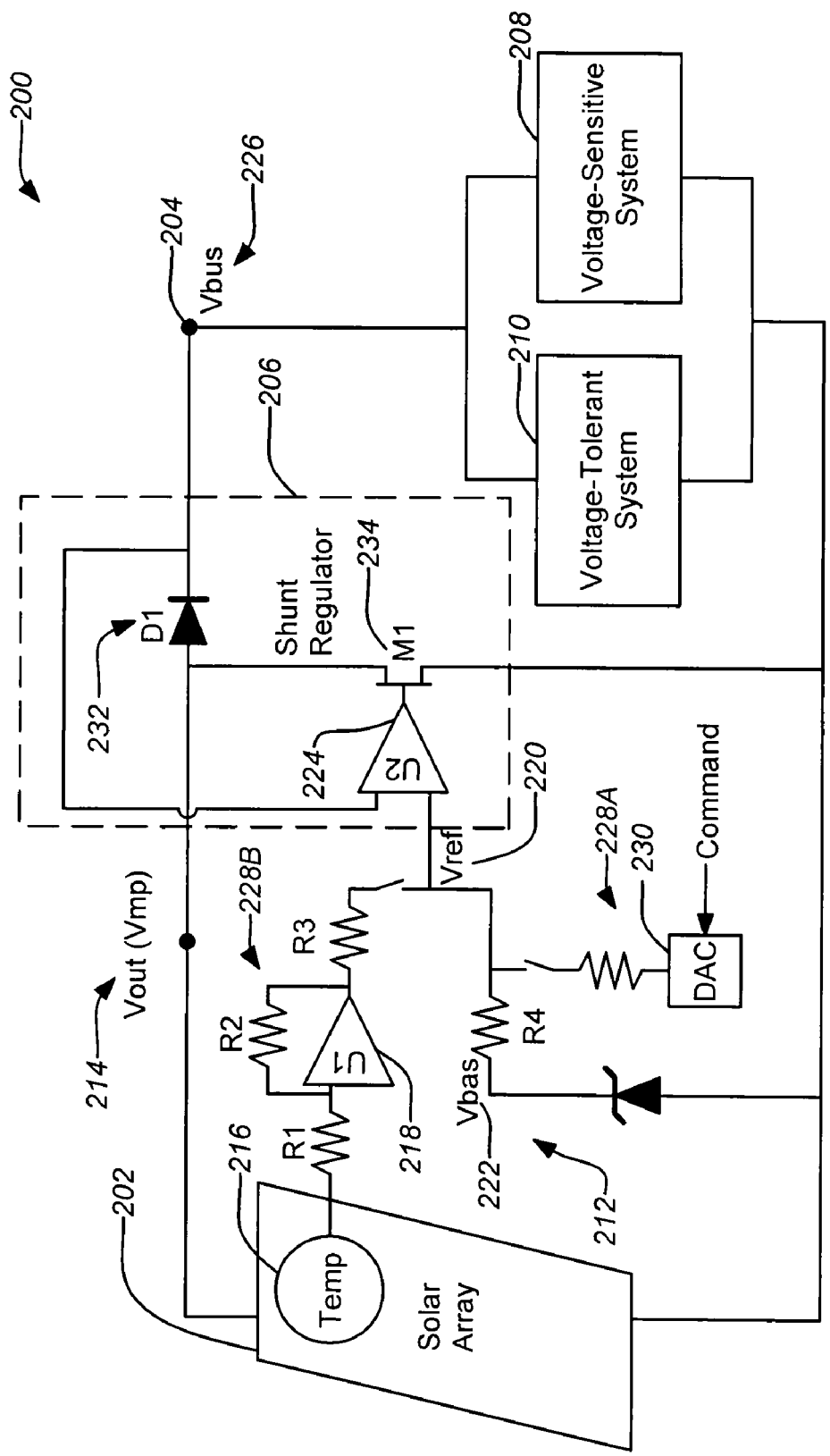
FIG. 2 illustrates an exemplary circuit for optimizing the power generation of a solar array.

FIG. 2 is an exemplary system 200 for optimizing the power generation of a solar array. The example system 200 comprises a solar array 202 converting solar radiation to electrical power provided to a power bus 204. The solar array provides the electrical power at an output voltage 214 from the array. Maximum power is delivered from the solar array 202 when the output voltage is Vmp consumed by the power bus 204 based on a variety of conditions (solar array age, season and temperature, etc.) as previously discussed. However, a regulator 206 (e.g., a shunt regulator) couples the solar array output voltage 214 to the power bus 204 and regulates the power bus 204. All the electrical systems 208, 210 are connected to the power bus 204 (but may be active or inactive at different times). Embodiments of the present disclosure distinguish all the powered electrical systems 208, 210 under one of two distinct classes, voltage-sensitive electrical systems 208 and voltage-tolerant electrical systems 210 (which may be referred to as "subsystems" in the context of a satellite or other larger system).

Voltage-tolerant electrical systems 210 are any electrical systems that can tolerate a wider bus voltage 226 range (e.g., maximum voltage may correspond to Vmp) of the solar array 202. In the example of a spacecraft, such as a satellite, some voltage-tolerant systems 210 might include electric propulsion (e.g., ion thrusters or Hall effect thrusters). Other voltage-tolerant systems typically include electrical heaters and motors.

On the other hand, voltage-sensitive electrical systems 208 are electrical systems that require a bus voltage 226 that is relatively stable. Specifically, voltage-sensitive electrical systems 208 cannot tolerate a bus voltage 226 that would vary with the output voltage 214 (e.g., which may correspond to Vmp) of the solar array 202. In the example of a spacecraft, such as a satellite, some voltage-sensitive systems 208 may include payload electronics (e.g., transmit and receive communications electronics or other sensor electronics). Some example voltage-sensitive devices include traveling wave tube amplifiers (TWTAs) and scientific instruments.

It should be noted that any voltage-sensitive system 208 may be redesigned to operate over a wider range of bus voltages 226 although they may be intolerant in a typical form. Similarly any existing voltage-sensitive system 208 can be modified to be a voltage-tolerant system 210. For example, one technique to accomplish this could be to design any front end voltage regulators to operate in wider voltage range but the regulator would be less optimized for weight and efficiency. However, this approach probably would not be efficient if applied to all the voltage-sensitive systems 208 due to the added weight and power. Some selective use may be appropriate for a few systems if they are required to be used with the voltage-tolerant systems 210. All payload units typically have front end regulators designed for wider voltage range and may be less optimized for weight and efficiency.

Referring back to operation of the shunt regulator 206 of FIG. 2, under conditions where at least one of the voltage-sensitive electrical systems 208 is active, the regulator 206 regulates the output voltage 214 of the solar array 202 to a bus voltage 226 that is below Vmp in order to protect the voltage-sensitive electrical system 208. (The lower bus voltage 226 is typically fixed at this level.) In this "normal" mode, when less power is required from the solar array 202 than it is capable of producing, the regulator 206 regulates the bus voltage 226 within a defined range and operates the solar array 202 at a voltage less than Vmp. The solar array 202 operates at the output voltage 214 Vmp only when additional power is required in a particular operating mode. To power the voltage-sensitive systems 208, the system 200 includes a voltage regulator 206 which is coupled to the solar array 202. The regulator 206 sets the output voltage 214 of the solar array 202 below Vmp and delivers this as a relatively stable bus voltage 226 at the power bus 204 within a defined range. The regulator 206 produces a bus voltage 226 that is determined by the magnitude of the control signal Vref 220 to amplifier U2 224 without the other reference signals 228A and 228B. Thus, in this mode the bus voltage 226 from the regulator 206 is determined by only the baseline reference signal Vbas 222.

However, the baseline reference signal Vbas 222 may be modified by one or more reference signals 228A, 228B (identified by their respective sub-circuits) to control the regulator 206, e.g., a commanded reference voltage signal 228A and/or a temperature sensing signal 228B, to set the bus voltage 226 at the power bus 204. Thus, the baseline reference signal Vbas 222 modified by one or more reference signals 228A, 228B to yield the combined control signal Vref 220 which determines the bus voltage 226. The temperature sensing signal 228B is the result of direct sensor feedback (described further below), whereas the example commanded reference voltage signal 228A may be manually or automatically controlled as desired.

Typically, the commanded reference voltage signal 228A may be a remotely programmable voltage reference from a commanded signal to a digital-to-analog controller (DAC) 230 that is combined with the baseline reference signal Vbas 222 to yield the reference voltage Vref 220 that directs the regulator 206 to set the nominal bus voltage 226. The reference voltage Vref 220 may be adjusted seasonally or as required based on determination of the current solar array peak power point. The peak power voltage Vmp may be determined by an autonomous or manual procedure. Thus, the system 200 allows the reference voltage Vref 220 to be remotely set. By changing the value of the reference voltage Vref 220, one can determine solar array power by examining the product of solar array current and solar array voltage. The reference voltage Vref 220 is set such that the product of the total solar array current and the output voltage of the regulator 206 at the power bus 204 (or solar array power) is at a maximum value. As previously mentioned the temperature of the solar array 202 may also be actively incorporated to adjust the bus voltage 226 (as set by the reference voltage Vref 220).

Maximum power output may be determined without any additional on-board electronics. For example, the commanded reference voltage signal 228A may first be adjusted by ground personnel through command telemetry to the satellite. Ground control sends a command to increase the reference Vref 220 (by changing the commanded reference voltage signal 228A) and observes how much power is delivered at Vbus 204. Then the ground control sends a command to decrease Vref 220 (also by changing the commanded reference voltage signal 228A) and observes how much power is delivered at Vbus 204. Though an iterative process, the ground operator can determine the optimal value for Vref 220; the reference voltage 220 that yields the most power. It should be noted that during peak power extraction, the solar array operating at Vmp is typically about IV higher than the bus voltage because there is a diode and effective series resistance between the solar array and the bus. By iteratively adjusting the bus voltage (through the commanded reference voltage signal 228A) in the manner described it is possible to determine that the solar array is operating at Vmp. It should also be noted that the delta change of Vmp due to aging and seasonal effects is very slow so it is not necessary to frequently adjust the bus voltage 226 set-point when extracting peak solar array power. Feedback that the maximum power is being achieved may be provided through spacecraft system telemetry for the total solar array current and bus voltage.

It is also important to note that the commanded reference voltage signal 228A may be implemented in any suitable manner. As described, a remote transmitted signal (e.g., command telemetry) to the DAC 230 adjusts the commanded reference voltage signal 228A. However, any digital control may be implemented as input to the DAC 230. For example, a programmable computing device may be used as input to the DAC with automated routines for a range of operating modes, e.g., eclipse mode, peak power finding, direct energy transfer, etc. However, this option adds complexity, mass, cost and reduces system reliability over a remotely controlled implementation.

An important element for an embodiment of the disclosure is a temporary mode of direct energy transfer to optimize power when only voltage-tolerant systems 210 are active (i.e., any voltage sensitive-systems 208 are inactive). In the example system 200, temporary direct energy transfer is implemented by diode 232 within the regulator 206 when all solar array current is passing to the load (regardless of the bus voltage set-point). When the load from the active systems 208, 210 (which may include voltage-sensitive and/or voltage-tolerant systems) is more than the power of the solar array 202 at the output voltage 214, typically the battery will begin to discharge in order to supply the additional power. However, if only voltage-tolerant systems 210 are active, the reference signals (particularly the commanded reference signal and optionally the one or more temperature sensors 202 as described below) may set the bus voltage 226 higher to allow more solar power extraction if it is needed. The shunt regulator 206 works the same regardless of voltage set-point and still shunts excess solar array current to regulate the bus voltage.

As described above, operation of the regulator 206 to set the bus voltage 226 may be directed through control of the reference voltage Vref 220 with one or more applied reference signals. Embodiments of the disclosure can essentially employ "direct energy transfer" to couple power directly from the solar array to the power bus. Direct energy transfer occurs when the solar array is connected directly to the power bus, e.g., through only a diode 232. This results in the lowest possible insertion loss and the highest possible system efficiency.

As shown in FIG. 2, control circuit 212 for the regulator 206 may also employ control responsive to changes in the temperature of the solar array 202. One or more temperature sensors 216 are mounted on the solar array 202 to provide a temperature sensing signal 228B corresponding to the temperature of the solar array. The one or more temperature sensors 216 are coupled through a gain amplifier 218 to modify the voltage reference signal Vref 220. In the example circuit of FIG. 2, the one or more temperature sensors 216 on the solar array 202 provide a temperature sensing signal 228B from amplifier U1 218 to modify the reference voltage Vref 220. The reference voltage Vref 220 is determined primarily by the baseline reference signal Vbas 222 but is further modified by combination with the temperature signal 228B from the one or more temperature sensors 216. As previously detailed, the reference voltage Vref 220 can also be further modified by a received command (e.g., from ground control in the case of a spacecraft) to apply a commanded reference voltage signal 228A.

The circuit elements may be configured such that a change in solar array temperature (sensed by the one or more sensors 216) results in a corresponding change in the delivered bus voltage Vbus 226 at the power bus 204 at a rate that causes Vbus 226 to change at the same rate as the output voltage 214 Vmp. To prevent excessively high bus voltages during eclipse periods driven by a drop in the sensed temperature, the range of voltage variation can be limited, e.g., to approximately Vnominal +/−10%. The nominal bus voltage 226 may be changed seasonally to account for predicted performance degradation of output voltage 214 Vmp associated with aging of the solar array 202.

Typically, the regulator 206 may be one of multiple voltage regulators that may be connected between the solar array 202 and the power bus 204. The various systems 208, 210 present a variable power load on the power bus 204. The regulator 206 regulates a solar array 202 at a peak power point through a control circuit 212 directed by one or more reference signals. The reference signals may comprise a commanded reference voltage signal 228A and a dynamic reference voltage signal (e.g., temperature sensing signal 228B from one or more temperature sensors 216). The commanded reference voltage signal 228A may be set based on an average temperature, the season and/or an age of the solar array to deliver a predicted peak power point.

Conventional peak power trackers are typically designed with higher insertion loss to optimize power generation of solar arrays. Conventional peak power trackers are capable of quickly changing their operating point to adjust for changes in the peak power point. However in practice, the peak power point changes very slowly for a given solar array, particularly in space applications. Thus, there is usually no advantage to having a peak power tracker that can adjust rapidly.

However, embodiments of the disclosure can change the operating bus voltage based on external commands that adjust the operating voltage to compensate for solar array voltage changes. Typically, these voltage changes occur relatively slowly, e.g., over a period of months. In addition, embodiments of the disclosure also can change the operating point as the solar array changes its temperature. Although the voltage tracking control for embodiments of the disclosure may respond more slowly than conventional peak power trackers, their response times are more than adequate for most solar array applications. In addition, embodiments of the disclosure are much simpler than conventional peak power trackers and therefore less expensive to build and test.

4. Optimizing Power Generation for a Solar Array in Space Applications

Although embodiments of the disclosure are not limited to space applications, there are particular benefits such applications. Because embodiments of the disclosure are particularly suited for providing higher beginning-of-life (BOL) power than conventional solar array systems, this is a particular advantage applied to electric propulsion in orbit raising, e.g., moving a satellite from lower orbit to higher orbit using only electric propulsion methods. It should be noted that although space applications will be described with particular reference to satellites, such embodiments of the disclosure are generally applicable to all forms of spacecraft as will be understood by those skilled in the art.

It is well known that electric propulsion systems are lighter and more efficient than chemical propulsion systems and provide a significant economic advantage. However, electric propulsion does require a great deal of electrical power, particularly when employed in orbit-raising at BOL for a satellite. Embodiments of the present disclosure are well suited for this application as they can provide an optimal solar array power extraction at BOL. This enables providing satellites with lower launch costs.

Figure 3:
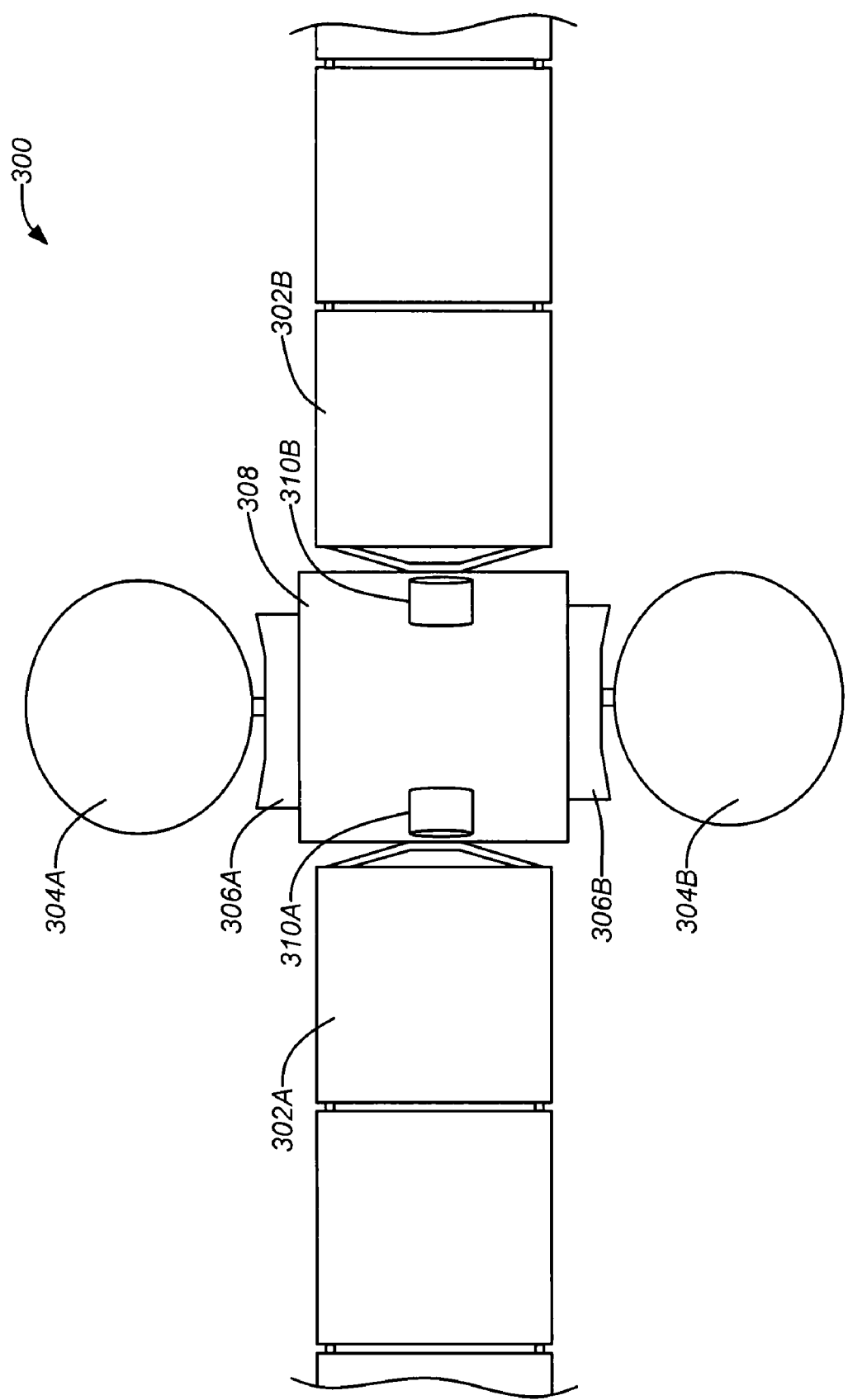
FIG. 3 illustrates an exemplary satellite system that can utilize an embodiments of the disclosure for optimizing power generation of the solar array.

FIG. 3 illustrates an exemplary satellite 300 that can utilize an embodiment of the disclosure for optimizing power generation of a solar array. The satellite 300 includes a solar array that comprises two wings 302A, 302B, each having multiple panels of photovoltaic cells. The wings are deployed from the satellite bus 308 some time after the satellite 300 is ejected from the rocket booster and generate electrical power for all the various systems operating on the satellite 300. In this example, the satellite provides a communications payload comprising two reflectors 304A, 304B which are deployed and positioned relative to the satellite bus 308. The reflectors 304A, 304B reflect receive and transmit signals to and from communication electronics through feed horns 306A, 306B disposed proximate to their respective reflectors 304A, 304B. This satellite 300 also includes electric propulsion, e.g., xenon ion thrusters 310A, 310B, which are positioned relative to the bus 308. Electric thrusters 310A, 310B are commonly employed for stationkeeping operations but may also be used in orbit raising if sufficient electrical power is available. As described herein, embodiments of the disclosure enable providing additional power for orbit raising using electric propulsion. Additional power through embodiments of the disclosure may be used to power additional experiments, more communication elements or any other electrical satellite system.

Embodiments of the disclosure have the capability to utilize the maximum solar array power, especially at beginning of life (BOL). In most space based systems, the solar array power generation capability degrades significantly over life. For example, over a fifteen year mission, the degradation rate approaches approximately 20% for a typical solar array. Typical conventional power systems are designed to optimize solar array power extraction only at end-of-life (EOL). Such systems are designed based on a fixed solar array operating voltage, and the bus voltage is designed to match the predicted EOL peak power point.

In contrast, embodiments of the present disclosure can provide more solar array power than peak power tracker at EOL due to the low insertion loss of direct energy transfer. Also, the conventional systems cannot take advantage of the higher solar array power at BOL because the conventional systems are biased to only operate at the relatively lower Vmp at EOL and forego the higher power Vmp at BOL.

Furthermore, when used in a low Earth orbit applications, embodiments of the disclosure can allow for maximum power extraction because the operating voltage may be constantly adjusted based on solar array temperature using a temperature sensing signal from one or more temperature sensors on the solar array as a reference signal for regulator the control circuit. As the solar array temperature changes, the system continuously adjusts the bus voltage such that power extraction can occur at Vmp of the solar array for the current temperature. This feature is advantageous because the solar array temperature is typically very cold for many minutes after exiting an eclipse and accordingly its Vmp is very high during this period. Thus, embodiments of the disclosure can operate at higher voltages and extract significantly more power than conventional systems when the solar array is cold. The temperature sensor is sufficiently fast to sense the changing solar array temperature.

5. Method of Optimizing Power Generation for a Solar Array

Embodiments of the disclosure also encompass a method of controlling the voltage of a solar array consistent with the foregoing apparatus. The method is particularly beneficial applied in space applications as previously described.

Figure 4:
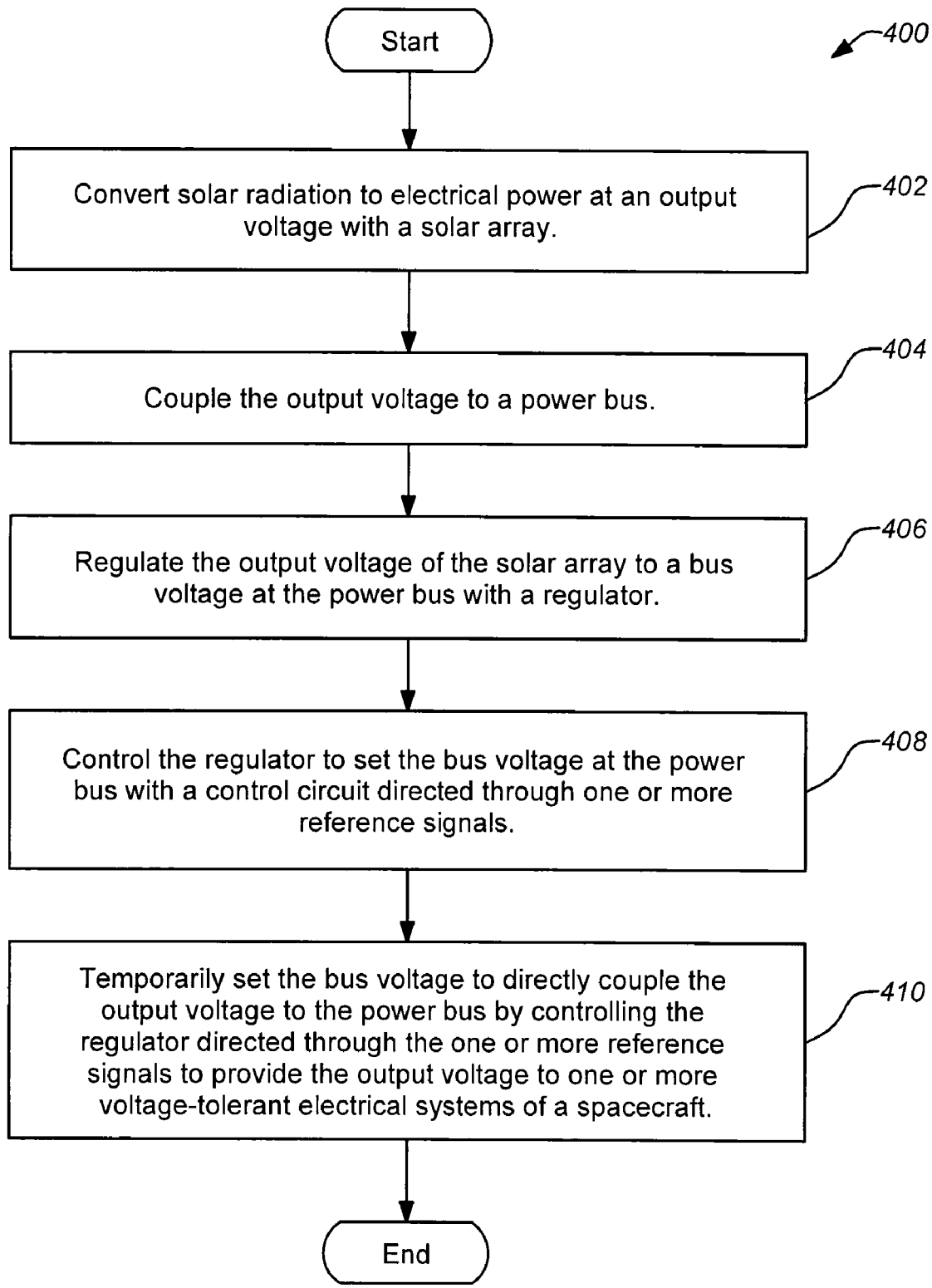
FIG. 4 is a flowchart of a method of optimizing the power generation of a solar array.

FIG. 4 is a flowchart of an exemplary method 400 of optimizing power generation for a solar array. The method 400 begins with an operation 402 of converting solar radiation to electrical power at an output voltage with a solar array. Next, in operation 404, the output voltage is coupled to a power bus. In operation 406, the output voltage of the solar array is regulated to a bus voltage at the power bus with a regulator. In operation 408, a control circuit directed through one or more reference signals controls the regulator to set the bus voltage at the power bus. In operation 410, the bus voltage is temporarily set to directly couple the output voltage to the power bus to provide the output voltage to one or more voltage-tolerant electrical systems of a spacecraft. This is directed through the one or more reference signals applied to the control circuit.

The method 400 may be further modified consistent with the apparatuses and systems described herein. For example, a voltage-tolerant electrical system may comprise an electric propulsion system of the spacecraft. In this case, temporarily setting the bus voltage higher is particularly useful to be provide more power for orbit-raising when employing the electric propulsion system. Typically, in this operational phase of the satellite, other voltage-sensitive systems of the satellite (e.g. payload electronics) are not operating.

This concludes the description including the preferred embodiments of the present disclosure. The foregoing description including the preferred embodiment of the disclosure has been presented for the purposes of illustration and description. It is not intended to be exhaustive or to limit the disclosure to the precise forms disclosed. Many modifications and variations are possible within the scope of the foregoing teachings. Additional variations of the present disclosure may be devised without departing from the inventive concept as set forth in the following claims.

What is claimed is:

1. An apparatus for regulating voltage of a solar array, comprising:
   a solar array for converting solar radiation to electrical power at an output voltage;
   a regulator for coupling the output voltage to a power bus and regulating a bus voltage at the power bus; and
   a control circuit directed through one or more reference signals including a baseline reference signal for controlling the regulator to set the bus voltage at the power bus;
   wherein the one or more reference signals directs the control circuit to temporarily set the bus voltage higher to selectively provide additional solar array power when only voltage-tolerant electrical systems of a spacecraft are operating and the control circuit otherwise sets the bus voltage to a lower bus voltage for operating one or more voltage-sensitive electrical systems of the spacecraft.

2. The apparatus of claim 1, wherein the one or more voltage-tolerant electrical systems comprises an electric propulsion system of the spacecraft and temporarily setting the bus voltage higher at the power bus is performed during an operational phase employing the electric propulsion system.

3. The apparatus of claim 1 wherein the one or more voltage-sensitive electrical systems comprises payload electronics for the spacecraft.

4. The apparatus of claim 1, wherein the one or more reference signals includes a temperature sensing signal from one or more temperature sensors for the solar array.

5. The apparatus of claim 1, wherein the one or more reference signals includes a commanded reference voltage signal.

6. The apparatus of claim 5, wherein the commanded reference voltage signal is set based on a season.

7. The apparatus of claim 5, wherein the commanded reference voltage signal is set based on an age of the solar array.

8. The apparatus of claim 5, wherein the commanded reference voltage signal is remotely transmitted to the control circuit.

9. The apparatus of claim 5, wherein the one or more reference signals further includes a temperature sensing signal from one or more temperature sensors for the solar array and both the temperature sensing signal and the commanded reference voltage signal are combined with the baseline reference signal to set the bus voltage at the power bus.

10. A method for regulating voltage of a solar array, comprising the steps of:
    converting solar radiation to electrical power at an output voltage with a solar array;
    coupling the output voltage to a power bus;
    regulating the output voltage of the solar array to a bus voltage at the power bus with a regulator;
    controlling the regulator to set the bus voltage at the power bus with a control circuit directed through one or more reference signals including a baseline reference signal; and
    temporarily setting the bus voltage higher to allow additional solar array power to supply to the power bus by controlling the regulator directed through the one or more reference signals to selectively provide additional solar array power when only voltage-tolerant electrical systems of a spacecraft are operating and the control circuit otherwise sets the bus voltage to a lower bus voltage for one or more voltage-sensitive electrical systems of the spacecraft.

11. The method of claim 10, wherein the one or more voltage-tolerant electrical systems comprises an electric propulsion system of the spacecraft and temporarily setting the bus voltage higher to provide additional solar array power to the power bus is performed during an operational phase employing the electric propulsion system.

12. The method of claim 10, wherein the one or more voltage-sensitive electrical systems comprises payload electronics for the spacecraft.

13. The method of claim 10, wherein the one or more reference signals includes a temperature sensing signal from one or more temperature sensors for the solar array.

14. The method of claim 10, wherein the one or more reference signals includes a commanded reference voltage signal.

15. The method of claim 14, wherein the commanded reference voltage signal is set based on a season.

16. The method of claim 14, wherein the commanded reference voltage signal is set based on an age of the solar array.

17. The method of claim 14, further comprising remotely transmitting the commanded reference voltage signal to the control circuit.

18. The method of claim 14, wherein the one or more reference signals further includes a temperature sensing signal from one or more temperature sensors for the solar array and setting the bus voltage at the power bus comprises combining both the temperature sensing signal and the commanded reference voltage signal with the baseline reference signal to control the regulator.

19. A system for regulating voltage of a solar array, comprising:
    a solar array means capable of converting solar radiation to electrical power at an output voltage coupled to a power bus;
    a regulator means capable of regulating the output voltage of the solar array to a bus voltage at the power bus; and
    a control circuit means capable of controlling the regulator to set the bus voltage at the power bus directed through one or more reference signals including a baseline reference signal;
    wherein the one or more reference signals direct the control circuit means to temporarily set the bus voltage higher to selectively provide additional solar array power when only voltage-tolerant electrical systems of a spacecraft are operating and the control circuit otherwise sets the bus voltage to a lower bus voltage for one or more voltage-sensitive electrical systems of a spacecraft.

20. The system of claim 19, wherein setting the bus voltage higher is performed when only the voltage-tolerant electrical systems of the spacecraft are operating and control circuit means otherwise sets the bus voltage to a lower bus voltage for one or more voltage-sensitive electrical systems of a spacecraft.

* * * * *